(12) United States Patent
Phatak et al.

(10) Patent No.: US 9,070,867 B2
(45) Date of Patent: Jun. 30, 2015

(54) NON-VOLATILE RESISTIVE-SWITCHING MEMORIES

(71) Applicant: Intermolecular Inc., San Jose, CA (US)

(72) Inventors: Prashant B Phatak, San Jose, CA (US); Tony P. Chiang, Campbell, CA (US); Pragati Kumar, Beaverton, OR (US); Michael Miller, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/549,680

(22) Filed: Nov. 21, 2014

(65) Prior Publication Data

US 2015/0097153 A1 Apr. 9, 2015

Related U.S. Application Data

(60) Continuation of application No. 14/046,029, filed on Oct. 4, 2013, now Pat. No. 8,921,156, which is a division of application No. 13/329,253, filed on Dec. 17, 2011, now Pat. No. 8,574,956, which is a continuation of application No. 12/255,109, filed on Oct. 21, 2008, now Pat. No. 8,129,704.

(60) Provisional application No. 61/049,752, filed on May 1, 2008.

(51) Int. Cl.
| | |
|---|---|
| *H01L 45/00* | (2006.01) |
| *H01L 47/00* | (2006.01) |
| *H01L 29/861* | (2006.01) |
| *G11C 13/00* | (2006.01) |
| *H01L 27/24* | (2006.01) |

(52) U.S. Cl.
CPC ............... *H01L 45/10* (2013.01); *H01L 47/00* (2013.01); *H01L 29/8615* (2013.01); *H01L 45/146* (2013.01); *H01L 45/08* (2013.01); *H01L 45/1233* (2013.01); *H01L 45/1616* (2013.01); *H01L 45/1625* (2013.01); *H01L 45/1641* (2013.01); *H01L 27/2409* (2013.01); *G11C 13/0007* (2013.01); *G11C 2213/32* (2013.01); *G11C 2213/55* (2013.01); *G11C 2213/72* (2013.01); *H01L 27/2463* (2013.01); *H01L 45/165* (2013.01); *H01L 45/1658* (2013.01); *H01L 45/1253* (2013.01)

(58) Field of Classification Search
CPC ..... H01L 45/10; H01L 45/08; H01L 45/1658; H01L 45/1641; H01L 45/1616; H01L 45/146; H01L 45/165
USPC .................. 257/2, 4, 310, E47.001, E21.645; 438/104, 900
See application file for complete search history.

(56) References Cited

U.S. PATENT DOCUMENTS

2006/0098472 A1* 5/2006 Ahn et al. .................... 365/145

* cited by examiner

*Primary Examiner* — Selim Ahmed

(57) ABSTRACT

Non-volatile resistive-switching memories are described, including a memory element having a first electrode, a second electrode, a metal oxide between the first electrode and the second electrode. The metal oxide switches using bulk-mediated switching, has a bandgap greater than 4 electron volts (eV), has a set voltage for a set operation of at least one volt per one hundred angstroms of a thickness of the metal oxide, and has a leakage current density less than 40 amps per square centimeter ($A/cm^2$) measured at 0.5 volts (V) per twenty angstroms of the thickness of the metal oxide.

20 Claims, 9 Drawing Sheets

NON-VOLATILE RESISTIVE-SWITCHING MEMORIES

PRIORITY CLAIM TO RELATED APPLICATIONS

This application is a continuation of U.S. patent application Ser. No. 14/046,029, filed on Oct. 4, 2013, which is a divisional claiming priority to U.S. patent application Ser. No. 13/329,253 filed 17 Dec. 2011 (issued as U.S. Pat. No. 8,574,956), which is itself a continuation of U.S. patent application Ser. No. 12/255,109 (issued as U.S. Pat. No. 8,129,704) filed on Oct. 21, 2008 and claiming priority to U.S. Provisional Pat. App. Ser. No. 61/049,752 filed on May 1, 2008, each of which is incorporated herein by reference for all purposes.

FIELD OF THE INVENTION

The present invention relates generally to electronic memories. More specifically, non-volatile resistive-switching memories are described.

BACKGROUND OF THE INVENTION

Non-volatile memories are semiconductor memories that retain their contents when unpowered. Non-volatile memories are used for storage in electronic devices such as digital cameras, cellular telephones, and music players, as well as in general computer systems, embedded systems and other electronic devices that require persistent storage. Non-volatile semiconductor memories can take the form of removable and portable memory cards or other memory modules, can be integrated into other types of circuits or devices, or can take any other desired form. Non-volatile semiconductor memories are becoming more prevalent because of their advantages of small size and persistence, having no moving parts, and requiring little power to operate.

Flash memory is a common type of non-volatile memory used in a variety of devices. Flash memory uses an architecture that can result in long access, erase, and write times. The operational speeds of electronic devices and storage demands of users are rapidly increasing. Flash memory is proving, in many instances, to be inadequate for non-volatile memory needs. Additionally, volatile memories (such as random access memory (RAM)) can potentially be replaced by non-volatile memories if the speeds of non-volatile memories are increased to meet the requirements for RAM and other applications currently using volatile memories.

Thus, what is needed is a new type of non-volatile memory. Memories that include elements which exhibit changes in resistive states in response to the application of voltages have been described. These memories typically have operational and durability limitations. Therefore, a resistive-switching memory with improved operational and durability characteristics is desired.

BRIEF DESCRIPTION OF THE DRAWINGS

Various embodiments of the invention are disclosed in the following detailed description and the accompanying drawings.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to various embodiments, resistive-switching memory elements can be formed that use bulk-mediated switching mechanisms. According to some of these embodiments, a metal-insulator-metal (MIM) memory element can be formed from two electrodes and one or more layers of one or more metal oxides disposed therebetween. A bulk switching mechanism, as used herein, describes changes in resistivity that are caused by events (e.g., the filling or emptying of defects) within the bulk of the metal oxide. In these embodiments, defects such as traps can be formed or enhanced in the metal oxide. The defects are filled to form non-metallic percolation paths by applying a set voltage pulse and emptied to break the percolation paths by applying a reset voltage pulse. The percolation paths formed during the set operation increase the conductivity of the metal oxide, thereby reducing the resistivity of the metal oxide and the memory element. The change in resistivity can be read at another voltage to determine the contents of the memory element. Materials for the metal oxide(s) and electrodes can be selected to enhance the characteristics of the memory element.

Some memory elements described herein may include a single layer of metal oxide that has certain characteristics, such as high bandgap, low leakage, bulk-switching properties, and a scalable (e.g., thickness dependent) set voltage. Other memory elements may include multiple layers of metal oxide and/or dopants to enhance or change the characteristics of the memory element. Additionally, at least one electrode of the memory element may be a noble or near noble metal.

I. Memory Structure

Figure 1:
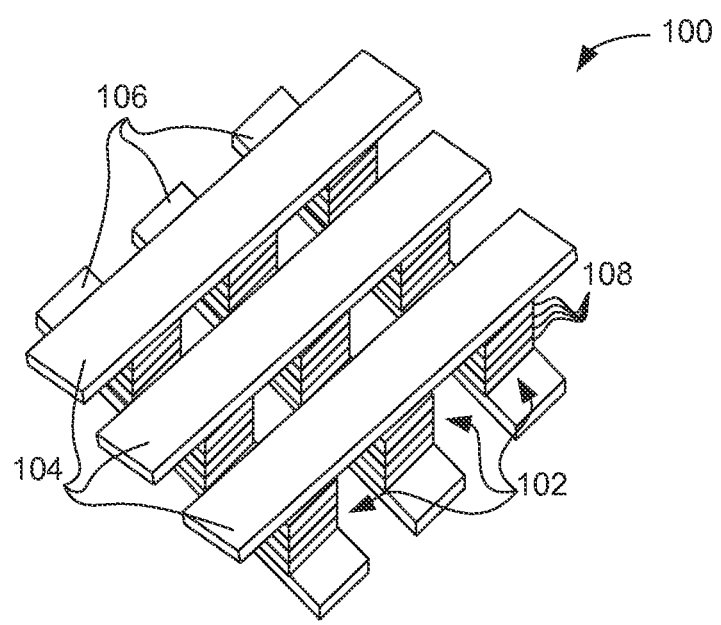
FIG. 1 illustrates a memory array of resistive switching memory elements.

FIG. 1 illustrates a memory array 100 of resistive switching memory elements 102. Memory array 100 may be part of a memory device or other integrated circuit. Memory array 100 is an example of potential memory configurations; it is understood that several other configurations are possible.

Read and write circuitry may be connected to memory elements 102 using signal lines 104 and orthogonal signal lines 106. Signal lines such as signal lines 104 and signal lines 106 are sometimes referred to as word lines and bit lines and are used to read and write data into the elements 102 of array 100. Individual memory elements 102 or groups of memory elements 102 can be addressed using appropriate sets of signal lines 104 and 106. Memory element 102 may be formed from one or more layers 108 of materials, as is described in further detail below. In addition, the memory arrays shown can be stacked in a vertical fashion to make multi-layer 3-D memory arrays.

Any suitable read and write circuitry and array layout scheme may be used to construct a non-volatile memory device from resistive switching memory elements such as element 102. For example, horizontal and vertical lines 104 and 106 may be connected directly to the terminals of resistive switching memory elements 102. This is merely illustrative.

Figure 4A:
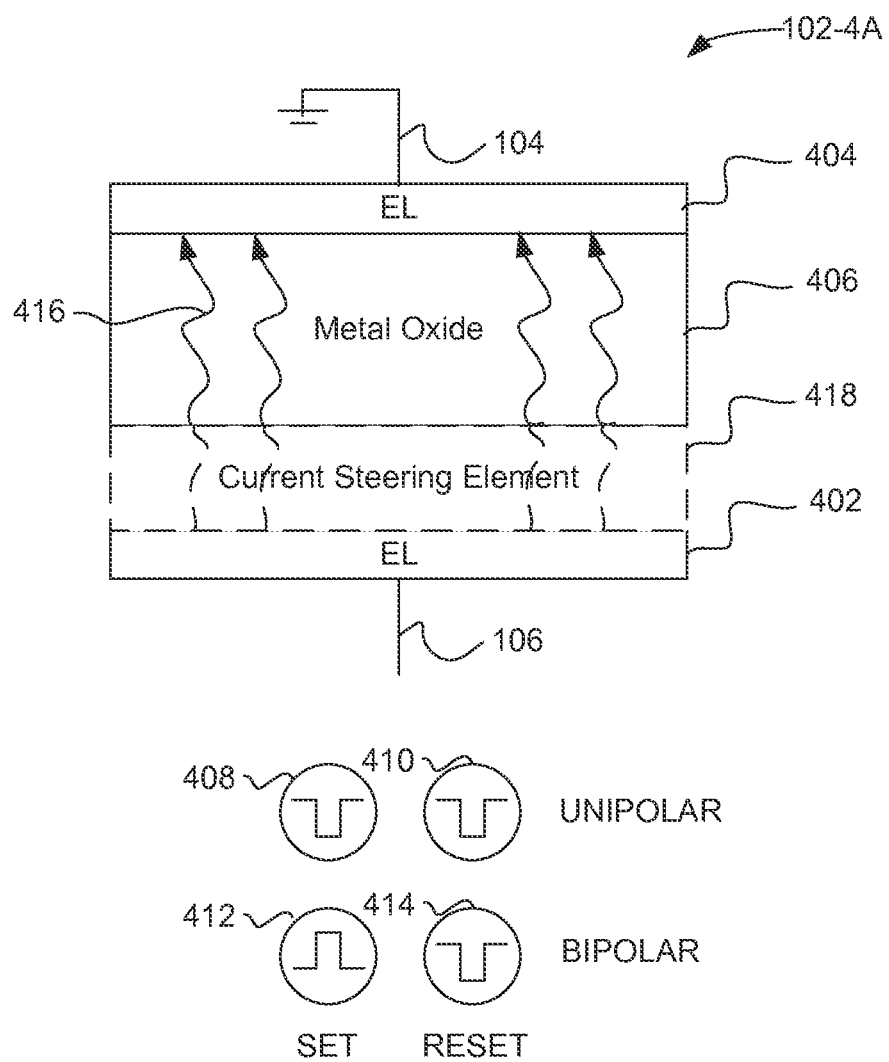
FIG. 4A illustrates an exemplary memory element according to various embodiments.

If desired, other electrical devices may be associated (i.e., be one or more of the layers 108) with each memory element 102 (see, e.g., FIG. 4A). These devices, which are sometimes referred to as current steering elements, may include, for example, diodes, p-i-n diodes, silicon diodes, silicon p-i-n diodes, transistors, etc. Current steering elements may be connected in series in any suitable locations in memory element 102.

II. Memory Operation

During a read operation, the state of a memory element 102 can be sensed by applying a sensing voltage (i.e., a "read" voltage) to an appropriate set of signal lines 104 and 106. Depending on its history, a memory element that is addressed in this way may be in either a high resistance state or a low resistance state. The resistance of the memory element therefore determines what digital data is being stored by the memory element. If the memory element has a high resistance, for example, the memory element may be said to contain a logic one (i.e., a "1" bit). If, on the other hand, the memory element has a low resistance, the memory element may be said to contain a logic zero (i.e., a "0" bit). During a write operation, the state of a memory element can be changed by application of suitable write signals to an appropriate set of signal lines 104 and 106.

Figure 2A:
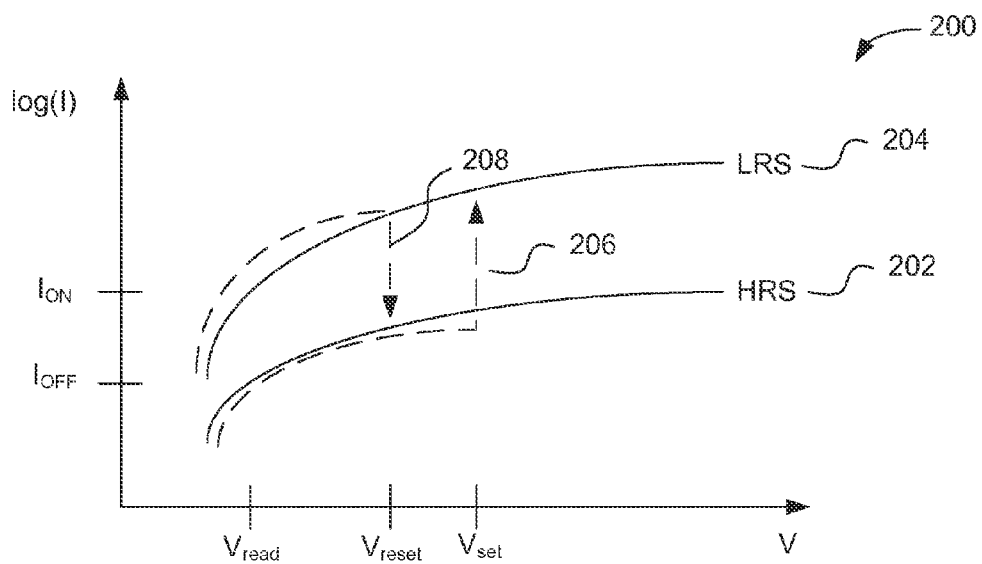
FIG. 2A is a logarithm of current (I) versus voltage (V) plot for a memory element.

FIG. 2A is a logarithm of current (I) versus voltage (V) plot 200 for a memory element 102. FIG. 2A illustrates the set and reset operations to change the contents of the memory element 102. Initially, memory element 102 may be in a high resistance state ("HRS", e.g., storing a logic zero). In this state, the current versus voltage characteristic of memory element 102 is represented by solid line HRS 202. The high resistance state of memory element 102 can be sensed by read and write circuitry using signal lines 104 and 106. For example, read and write circuitry may apply a read voltage $V_{READ}$ to memory element 102 and can sense the resulting "off" current $I_{OFF}$ that flows through memory element 102. When it is desired to store a logic one in memory element 102, memory element 102 can be placed into its low-resistance state. This may be accomplished by using read and write circuitry to apply a set voltage $V_{SET}$ across signal lines 104 and 106. Applying $V_{SET}$ to memory element 102 causes memory element 102 to switch to its low resistance state, as indicated by dashed line 206. In this region, the memory element 102 is changed so that, following removal of the set voltage $V_{SET}$, memory element 102 is characterized by low resistance curve LRS 204. As is described further below, the change in the resistive state of memory element 102 may be because of the filling of traps (i.e., a may be "trap-mediated") in a metal oxide material.

The low resistance state of memory element 102 can be sensed using read and write circuitry. When a read voltage $V_{READ}$ is applied to resistive switching memory element 102, read and write circuitry will sense the relatively high "on" current value $I_{ON}$, indicating that memory element 102 is in its low resistance state. When it is desired to store a logic zero in memory element 102, the memory element can once again be placed in its high resistance state by applying a reset voltage $V_{RESET}$ to memory element 102. When read and write circuitry applies $V_{RESET}$ to memory element 102, memory element 102 enters its high resistance state HRS, as indicated by dashed line 208. When the reset voltage $V_{RESET}$ is removed from memory element 102, memory element 102 will once again be characterized by high resistance line HRS 204. Voltage pulses (see FIG. 4A) can be used in the programming of the memory element 102.

A forming voltage $V_{FORM}$ is a voltage applied to the memory element 102 to ready the memory element 102 for use. Some memory elements described herein may need a forming event that includes the application of a voltage greater than or equal to the set voltage or reset voltage. Once the memory element 102 initially switches, the set and reset voltages can be used to change the resistance state of the memory element 102.

The bistable resistance of resistive switching memory element 102 makes memory element 102 suitable for storing digital data. Because no changes take place in the stored data in the absence of application of the voltages $V_{SET}$ and $V_{RESET}$, memory formed from elements such as element 102 is non-volatile. As can be appreciated, it is desirable for memory element 102 to have a large difference between off current and on current (i.e., a high $I_{ON}/I_{OFF}$ ratio), which causes the on and off states of the memory element to be more discrete and easily detectable.

III. Switching Mechanisms

A. Bulk-Mediated Switching

In its most basic form, the layers 108 of the memory element 102 include two electrodes (each having one or more materials and/or layers) and one or more layers of one or more metal oxides disposed in between. The memory element 102 generally has a metal-insulator-metal (MIM) capacitor structure, although other structures such as metal-insulator-insulator-metal (MIIM) and metal-insulator-insulator-insulator-metal (MIIIM) can be used as described herein. In other embodiments, additional conductors can be added to the structure, for example to form metal-insulator-metal-insulator-metal (MIMIM) or other capacitor structures.

Without being bound by theory, the memory element 102 uses a switching mechanism that is mediated in the bulk of the metal oxide. In one embodiment, the switching mechanism uses non-metallic conductive paths rather than filamentary or metallic conductive paths (see FIG. 4A). Generally, defects are formed in, already exist in the deposited metal oxide, and existing defects can be enhanced by additional processes. Defects may take the form of variances in charge in the structure of the metal oxide. For example, some charge carriers may be absent from the structure (i.e., vacancies) or additional charge carriers may be present (i.e., interstitials).

Therefore, by applying a voltage to the memory element 102, the defects, such as traps, can either be filled or emptied to alter the resistivity of a metal oxide and resistive switching memory elements can be formed using these principles.

The set voltage is dependent on the thickness of the metal oxide layer (see discussion regarding FIGS. 3A-3C) which indicates a bulk-mediated switching mechanism. Generally, the bulk-mediated switching mechanism forms percolation paths through the bulk of the metal oxide The metal oxides have any phase (e.g., crystalline and amorphous) or mixtures of multiple phases. The deposited metal oxides can have impurities (i.e., substitutional defects) such as an aluminum atom where a hafnium atom should be, vacancies (missing atoms), and interstitials (extra atoms). Amorphous-phase metal oxides may have increased resistivity, which in some embodiments can lower the operational currents of the device to reduce potential damage to the memory element 102.

Figure 2B:
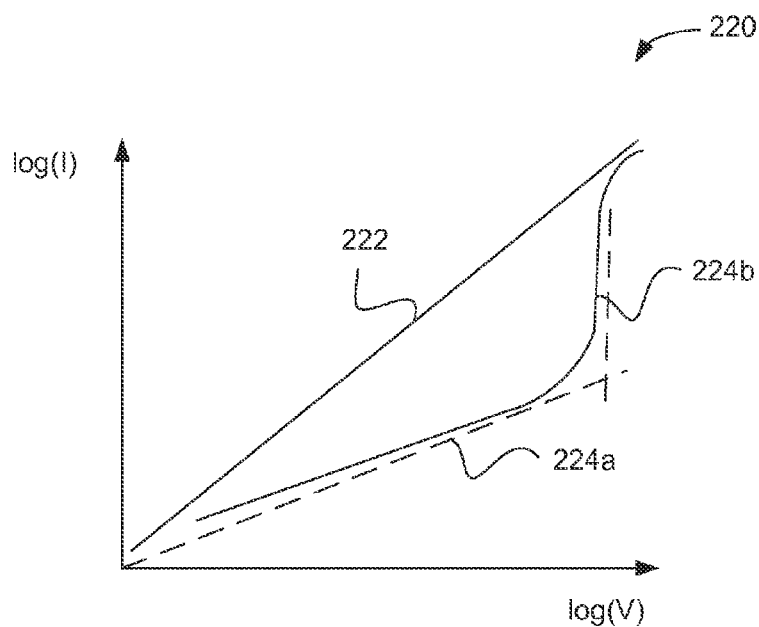
FIG. 2B is a logarithm of current (I) versus logarithm voltage (V) plot for a memory element that demonstrates a resistance state change.

FIG. 2B is a current (I) versus voltage (V) plot 220 for a memory element 102 that demonstrates a resistance state change. The plot 220 shows a voltage ramp applied to the memory element 102 along the x-axis and the resulting current along a y-axis. The line 222 represents the response of an Ohmic material when the ramped voltage is applied. An Ohmic response is undesirable, since there is no discrete voltage at which the set or reset occurs.

Generally, a more abrupt response like graph 224 is desired. The graph 224 begins with an Ohmic response 224a, and then curves sharply upward 224b. The graph 224 may represent a set operation, where the memory element 102 switches from the HRS 202 to the LRS 204.

Without being bound by theory, non-metallic percolation paths are formed during a set operation and broken during a reset operation. For example, during a set operation, the memory element 102 switches to a low resistance state. The percolation paths that are formed by filling traps increase the conductivity of the metal oxide, thereby reducing (i.e., changing) the resistivity. The voltage represented by 224b is the set voltage. At the set voltage, the traps are filled and there is a large jump in current as the resistivity of the metal oxide decreases. Percolation paths are illustrated in FIG. 4A.

The set voltage shown here is very discrete (i.e., vertical), which is desirable to ensure the switching of the memory element occurs at a repeatable voltage. Additionally, a high ratio of on current to off current (i.e., a high $I_{ON}/I_{OFF}$ ratio), for example 10 or greater, is desirable because it indicates a large difference in the resistivity of the metal oxide when in the HRS and LRS, making the state of the memory element easier to determine. Finally, it is desirable to have low set, reset, and switching voltages in order to avoid damage to the memory elements and to be compatible with complementary device elements (see FIG. 4A) such as diodes and/or transistors in series with the memory element 102.

The percolation paths can be described as non-metallic. With metallic materials, resistivity decreases with lower temperature. The memory elements 102 described herein demonstrate an increase in resistance (e.g., the LRS) with decreases in operating temperatures.

B. Defects

The metal oxide includes electrically active defects (also known as traps) in the bulk. It is believed that the traps can be filled by the application of the set voltage, and emptied by applying the reset voltage. Traps can be inherent in the metal oxide (i.e., existing from formation of the metal oxide) or created by doping, and enhanced by doping and other processes. For example, a hafnium oxide layer may include oxygen or hafnium vacancies or oxygen or hafnium interstitials that may form traps which can be used to create percolation paths and alter the conductivity of the hafnium oxide layer.

A metal oxide may include defects that are the result of the process used to form the metal oxide. In other words, the defects may be inherent in the metal oxide. For example, physical vapor deposition (PVD) processes and atomic layer deposition (ALD) processes deposit layers that will always have some imperfections or flaws. These imperfections can generally be referred to as defects in the structure of the metal oxide. The defects can be used to create localized charge variances that can be filled and emptied by applying voltage pulses to the metal oxides. Defects can also be created by doping, which is explained in more detail below. Other processes (e.g., annealing) can be used to change and/or enhance defects of a metal oxide to improve resistive switching characteristics.

C. Scaling and Bandgap

Figure 3A:
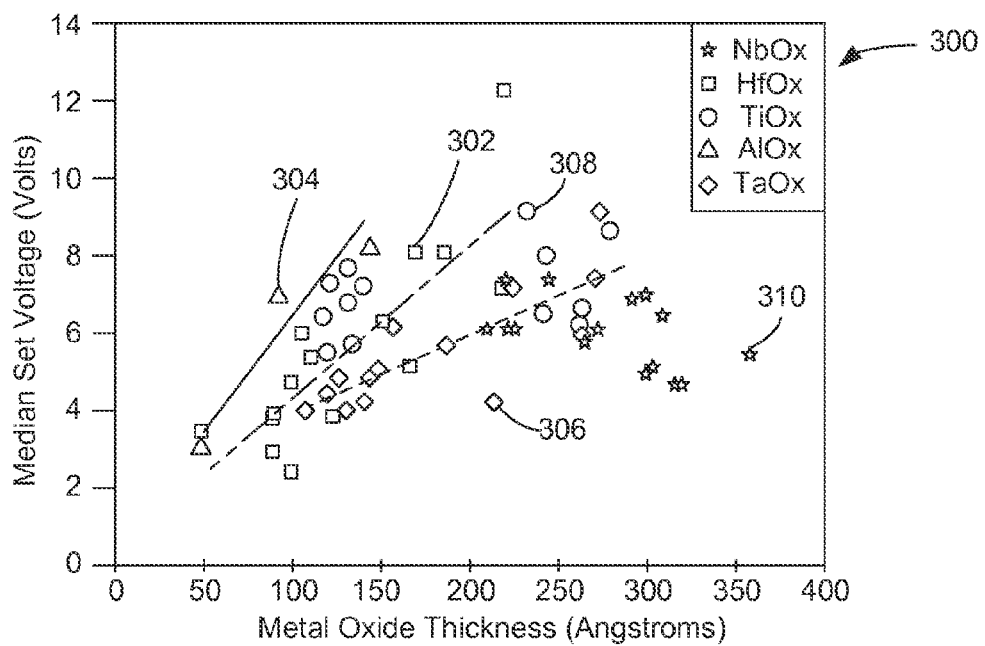
FIGS. 3A-3C are graphs showing the relationship between thickness of a metal oxide layer and set voltage, reset voltage, and on/off current ratios for several materials systems used in memory elements described herein.
Figure 3B:
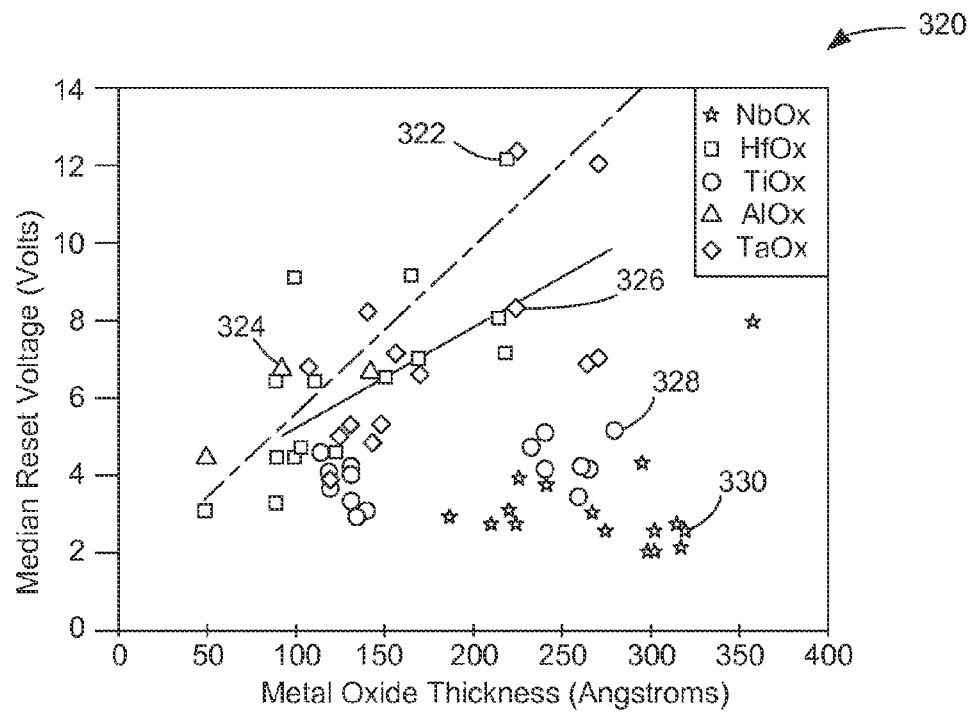
Figure 3C:
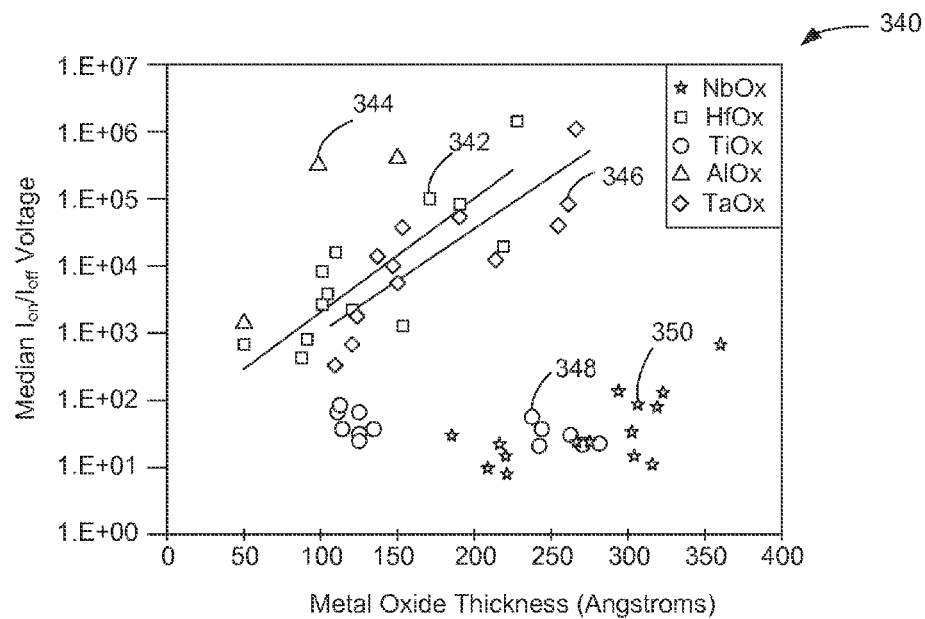

FIGS. 3A-3C are graphs showing the relationship between thicknesses of a metal oxide layer and resulting set voltages, reset voltages, and on/off current ratios for several materials systems used in memory elements described herein. These graphs illustrate the characteristics of a memory element that includes two electrodes and a single layer of metal oxide disposed in between. As can be seen in FIG. 3A, for memory elements including hafnium oxide 302, aluminum oxide 304, or tantalum oxide 306, set voltage increases with (i.e., is dependent on) thickness, and in some embodiments and for these materials the set voltage is at least one volt (V) per one hundred angstroms (Å) of the thickness of a metal oxide layer in the memory element. In some embodiments, an increase in the thickness of the metal oxide layer of 100 Å increases the set voltage by at least 1V. Similarly, as shown in FIG. 3B, reset voltage for hafnium oxide 322, aluminum oxide 324, or tantalum oxide 326 also depends on thickness. These data therefore support a bulk-controlled set/reset mechanism for these materials, since a linear relationship indicates the formation of percolation paths throughout the bulk of the metal oxide. In other words, for a thicker material, more voltage is needed to fill the traps.

Hafnium oxide (5.7 electron volts (eV)), aluminum oxide (8.4 eV) and tantalum oxide (4.6 eV) all have a bandgap greater than 4 eV, while titanium oxide (3.0 eV) and niobium oxide (3.4 eV) have bandgaps less than 4 eV. Other higher bandgap metal oxides that can be used with various embodiments described herein include yttrium oxide and zirconium oxide. As shown in FIGS. 3A and 3B, set voltages for titanium oxide 308 and niobium oxide 310 and reset voltages for titanium oxide 328 and niobium oxide 330 do not increase with thickness. Therefore, a higher bandgap (i.e., bandgap greater than 4 eV) metal oxide exhibits bulk mediated switching and scalable set and reset voltages. In other words, set and reset voltages can be reduced by reducing the thickness of the high bandgap metal oxides such as hafnium oxide. Therefore, for smaller devices, set and reset voltages can be lowered.

FIG. 3C shows a relationship between the $I_{ON}/I_{OFF}$ ratio and the thickness of a metal oxide layer. Metal oxides that have bandgaps greater than 4 eV (i.e., hafnium oxide 342, aluminum oxide 344, and tantalum oxide 346, as well as other higher-bandgap materials such as zirconium oxide and yttrium oxide) show a scaling relationship between $I_{ON}/I_{OFF}$ ratio and thickness. Additionally, for increasing bandgap, the $I_{ON}/I_{OFF}$ ratio increases. Conversely, materials having a bandgap less than 4 eV (i.e., titanium oxide 348 and niobium oxide 350) exhibit an $I_{ON}/I_{OFF}$ ratio that is independent of oxide thickness. Additionally, the higher bandgap materials generally have higher $I_{ON}/I_{OFF}$ ratios, which improve the ability to distinguish between the off state and the on state of the memory element.

Figure 3D:
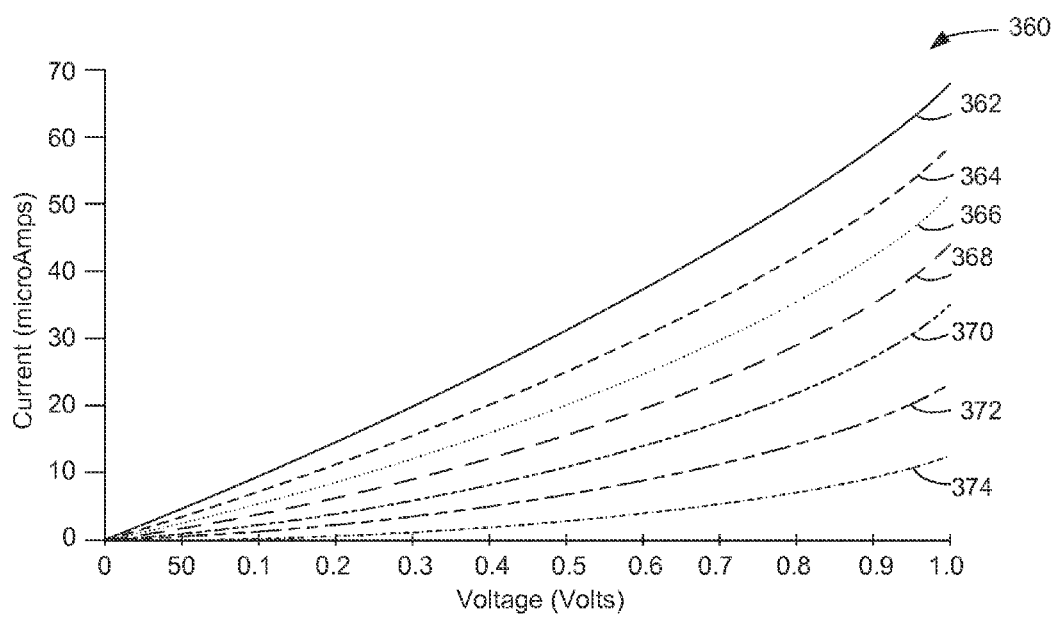
FIG. 3D is a graph that illustrates a non-metallic nature of metal oxides used for the memory elements described herein

FIG. 3D is a graph 360 that illustrates a non-metallic nature of metal oxides used for the memory elements described herein. The graph 360 shows increasing resistivity for a high-bandgap (i.e., greater than 4 eV) oxide layer with decreasing temperatures, which is a characteristic of a non-metallic material. The graph 360 shows a sweep in voltage on the x-axis versus current on the y-axis. As can be seen the measurements 362 taken at 300 Kelvin (K) show the greatest current output, and thus lowest resistivity. The measurements 364 taken at 250K, 366 taken at 150K, 368 taken at 100K, 370 taken at 60K, 372 taken at 50K, and 374 taken at 10K show increasing resistivity (i.e., lower current) as the temperature decreases. This is a characteristic of non-metallic materials; some embodiments described herein include metal oxides that exhibit non-metallic switching mechanisms.

IV. Memory Element Structures

A. Design Considerations

Generally, as described above, a resistive-switching memory element switches from a low resistance state to a high resistance state and vice versa. Also as described above, a desirable resistive-switching memory element in some embodiments has low set and reset voltages and a high $I_{ON}/I_{OFF}$ ratio. A materials system for achieving these goals includes a metal oxide that:

1. Exhibits bulk-mediated switching
2. Includes a base metal oxide that has a bandgap of greater than 4 electron volts (eV)
3. Has a set voltage of at least one volt per one hundred angstroms of thickness of the base metal oxide
4. Has a leakage current density of less than 40 amps per square centimeter measured at 0.5 V per twenty angstroms of thickness of the base metal oxide in an off state of the memory element Other design considerations may include using more than one metal oxide in a single layer (co-deposition) or multiple layers (stacked), using electrodes that have different work functions, using at least one noble metal electrode, using different metal oxides having different bandgaps, and using low leakage materials. The off current is related to the leakage of the material and the size of the device. Generally, the leakage should be low enough that the off current remains low enough to provide adequate separation between the on and off currents (i.e., a sufficiently high $I_{ON}/I_{OFF}$ ratio). Leakage is related to $I_{OFF}$, and the 40 A/cm² measured at 0.5 V per 20 Å of oxide thickness in an off state of the memory element described herein gives an off current that is low enough to give a reliably high $I_{ON}/I_{OFF}$ ratio.

B. Materials

1. Metal Oxides

Specific metal oxides for use as a base layer in a memory element and that use bulk-mediated switching mechanisms according to embodiments of the invention include hafnium oxide, aluminum oxide, tantalum oxide, zirconium oxide, and yttrium oxide. These metal oxides have a bandgap that is greater than 4 eV, indicating that they are more insulating and therefore have a higher resistivity. As is explained regarding FIGS. 3A-3C, higher bandgap (i.e., greater than 4 eV) metal oxides also allow for scaling of set voltage as related to metal oxide thickness.

These oxides can be doped with each other and additionally, for example, scandium oxide, yttrium oxide, and nickel oxide. Other dopants may include rare earth metals such as lanthanum, cerium, praseodymium, neodymium, gadolinium, erbium, ytterbium, and lutetium and their oxides. Additional dopants may include hafnium, hafnium oxide, titanium oxide, niobium oxide, oxygen, silicon, silicon oxide, nitrogen, fluorine, chromium, and chromium oxide.

Dopants can be selected by considering probable oxidation states that can create defects. For example, hafnium atoms can have a +4 ($Hf^{+4}$) oxidation state, and aluminum atoms can have a +3 ($Al^{+3}$) oxidation state. Aluminum oxide can be doped into hafnium oxide creating charge imbalances by creating substitutional defects where aluminum atoms replace hafnium atoms (i.e., $Al_{Hf}^{1-}$) and vice versa (i.e., $Hf_{Al}^{1+}$). These defects allow for the formation of percolation paths in the bulk of the metal oxide.

Another criterion for selecting dopants can be the difference between the valence (e.g., for a p-type dopant) or conduction (e.g., for an n-type dopant) band of the dopant and the valence or conduction band of the metal oxide. In some embodiments, a difference between the valence bands that is greater than 50 meV can provide deep-level dopants that can form deeper and more accessible traps in the bulk.

According to some embodiments, the dopant may be the same metal as the metal oxide into which the dopant is doped. For example, a hafnium oxide layer can be doped with hafnium ions. The doping can be performed using implantation, for example. Implantation energy may generally be in the range of 0.5 keV to 10 keV depending on the ion being implanted and the thickness of the metal oxide. This doping can improve yield of the memory elements.

Doping can be performed either isovalently or aliovalently, and can be performed by interdiffusion, implantation, or co-deposition. For example, doping can be performed by interdiffusion by depositing two layers of metal oxides (e.g., hafnium oxide and aluminum oxide or hafnium oxide and titanium oxide). These layers can then be thermally treated by, for example, rapid thermal anneal (RTA), rapid thermal oxidation (RTO) or a forming gas anneal. The thermal treatment causes interdiffusion of defect species between the materials, creating localized charge differences which can serve as trap states.

Another criterion for selecting a metal oxide can be to have a metal nitride electrode and a metal oxide adjacent to the metal nitride electrode. The metal to form the metal oxide and the metal nitride are the same. For example, a memory element can be formed having a titanium nitride electrode and a titanium oxide layer adjacent to the titanium nitride electrode. This serves to stabilize the interface, for example. The memory element can also include other metal oxides (e.g., aluminum oxide or hafnium oxide) in a stacked or co-deposited manner.

In another embodiment, two metal oxides can be stacked in layers to adjust the effective on current of the memory element 102. The first metal oxide can have a smaller on current than the second metal oxide material and the second metal oxide material can have a lower off current than the first metal oxide material. In these embodiments, the memory element 102 can have the lower off current of the second metal oxide material and the lower on current of the first metal oxide material to make the memory element 102 compatible with other device elements, for example a diode or transistor in series with the memory elements.

2. Electrodes

Electrode materials may include silicon, silicides, titanium nitride (TiN), platinum, nickel, iridium, iridium oxide, tantalum nitride, ruthenium and ruthenium oxide. Electrodes can also be alloys such as a ruthenium-titanium alloy or a nickel-titanium alloy. According to some embodiments, one electrode may be a higher work function material, and the other electrode may be a lower work function material. For example, in one embodiment, at least one electrode is a high work function material such as a noble or near noble metal (i.e., a metal with a low absolute value (i.e., negative or positive) free energy change (|ΔG|) of oxide formation). Noble or near noble metals may include nickel, iridium, iridium oxide, platinum, ruthenium, and ruthenium oxide. The other electrode may be a lower work function material such as titanium nitride, or may also be a noble or near noble material. In some embodiments, the reset pulse at the electrode having the higher work function is a positive pulse (i.e., the higher work function electrode is the anode of the memory element).

In other embodiments, the electrodes can be multi-layer electrodes that can include one or more different materials. For example, an electrode can include a layer of ruthenium and ruthenium oxide, or a layer of iridium, iridium oxide, or platinum with a capping layer of tungsten, tungsten carbonitride, or tungsten carbon. Another potential multi-layer electrode is a tantalum nitride/nickel/tantalum nitride stack. The multi-layer electrodes can be used to improve adhesion properties and performance of memory elements in some configurations and embodiments.

C. Single Layer of Oxide

FIG. 4A illustrates an exemplary memory element 102-4A according to various embodiments. As is described below, various different configurations of memory element 102 are possible; the memory element 102-4A shown in FIG. 4A is one example of a memory element 102 that can be used with memory array 100.

The memory element 102-4A includes two electrodes 402 and 404. The electrodes 402 and 404 can be formed using any appropriate process, such as PVD, CVD, ALD, etc., and can have any appropriate thickness, for example 10-2000 Å.

A bottom electrode 402 is, in some embodiments, nearer a substrate on which the memory element 102-4A is formed. A top electrode 404 is further from the substrate. Although "bottom" and "top" are used to describe the electrodes for some systems, it is understood that the memory element 102-4A may have any orientation relative to the substrate, signal lines, word lines and bit lines, or other components of the memory array 100, and that the memory element 102-4A may be formed in reverse order from what is shown.

In some embodiments, the bottom electrode 402 may include silicon, silicide, or titanium nitride electrodes. The top electrode can include a higher work function material (e.g., a noble or near noble material) such as platinum, nickel, iridium, iridium oxide, ruthenium, ruthenium oxide, titanium nitride, tantalum nitride, ruthenium-titanium alloys, or nickel-titanium alloys, or can be multi-layer electrodes such as tantalum nitride/nickel/tantalum nitride electrodes.

The electrodes 402 and 404 may be adjacent to or otherwise in electrical communication with signal lines 104 and 106. The signal lines 104 and 106 can be any conductor such as tungsten, aluminum, or copper.

A metal oxide 406 is between the electrodes 402 and 404. The memory element 102-4A may be described as an MIM stack. The metal oxide 406 may in some embodiments be described as a transition metal oxide, and may be a binary metal oxide, ternary metal oxide, or some other combination of the materials described above. The metal oxide can be deposited using any appropriate technique including dry (CVD, ALD, PVD, PLD, evaporation) and wet (electroless deposition, electrochemical deposition) techniques. If the metal oxide is a binary or ternary metal oxide, the metal oxide 406 may be co-deposited (e.g., co-sputtered or co-injected using ALD or CVD, see FIG. 6). The electrodes 402 and 404 and the metal oxide 406 are layers 108 of the memory element 102 shown in FIG. 1.

1. Set and Reset Pulses

The metal oxide 406 uses a bulk-mediated switching mechanism as described above. In one embodiment, the electrode 404 is grounded and voltage pulses are applied to the electrode 402. In a unipolar embodiment, for example, the set pulse 408 and reset pulse 410 are both negative. In a bipolar embodiment, the set pulse 412 is positive while the reset pulse 414 is negative. Alternatively, the electrode 402 is grounded and pulses are applied to the electrode 404. In the alternative embodiment, for unipolar switching, both the set and reset voltage pulses applied to the electrode 404 are positive. In the bipolar embodiment, the set voltage is negative and the reset voltage is positive.

The electrode that is positive for the reset voltage pulse is described herein as the anode. The anode is positive for reset, and may be either positive for the set (for unipolar embodiments) or negative for the set (for bipolar embodiments). Generally, the set and reset voltages may either have a same relative polarity (unipolar) or a different relative polarity (bipolar).

2. Percolation Paths

In some embodiments, percolation paths 416 are believed to originate from electrode 402 and spread toward electrode 404. With the memory elements 102, the anode is the electrode at which the reset pulse is positive (i.e., the electrode 404). In the memory elements 102, the percolation paths 416 originate from the cathode and, as traps are filled, migrate toward the anode in the presence of the set voltage pulse 408 or 412. The reset pulse 410 subsequently destroys the percolation paths 416. In some embodiments, oxygen ($O^{2-}$) defects may be the mobile species that lead to the formation of the percolation paths.

3. Current Steering Element

The memory element 102-4A (as well as other memory elements 102 described herein) can include an optional complementary device such as a current steering element 418. The current steering element 418 is in series with the memory element 102, and may be, for example, a diode or transistor. The current steering element 418 can be located anywhere with respect to memory element 102 (e.g., between the metal oxide 406 and the electrode 404).

4. Hafnium Oxide System

One system that meets the criteria of low set, reset, and forming voltages and a high on/off current ratio is a single layer hafnium oxide memory element 102-4A. One example is a system including a hafnium oxide base layer 406, a titanium nitride, silicide, or silicon electrode 402, and a noble or near noble metal (e.g., platinum, nickel, iridium, iridium oxide, ruthenium, ruthenium oxide, tantalum nitride, ruthenium titanium alloys, nickel titanium alloys, or multi-layer electrodes described above) electrode 404. The layers 402-406 can be deposited using any deposition technique, such as physical vapor deposition (PVD), atomic layer deposition (ALD), chemical vapor deposition (CVD), or evaporation. ALD may be used to deposit very thin conformal layers in some embodiments.

Figure 4C:
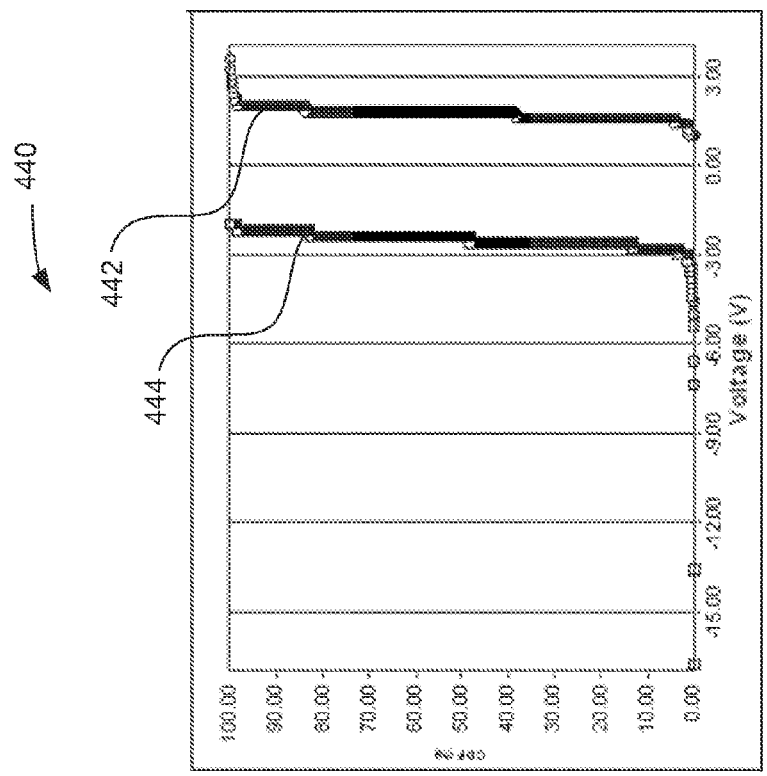
FIGS. 4B and 4C are distribution graphs and showing off current, on current, set voltage, and reset voltage for a sample of memory elements.
Figure 4B:
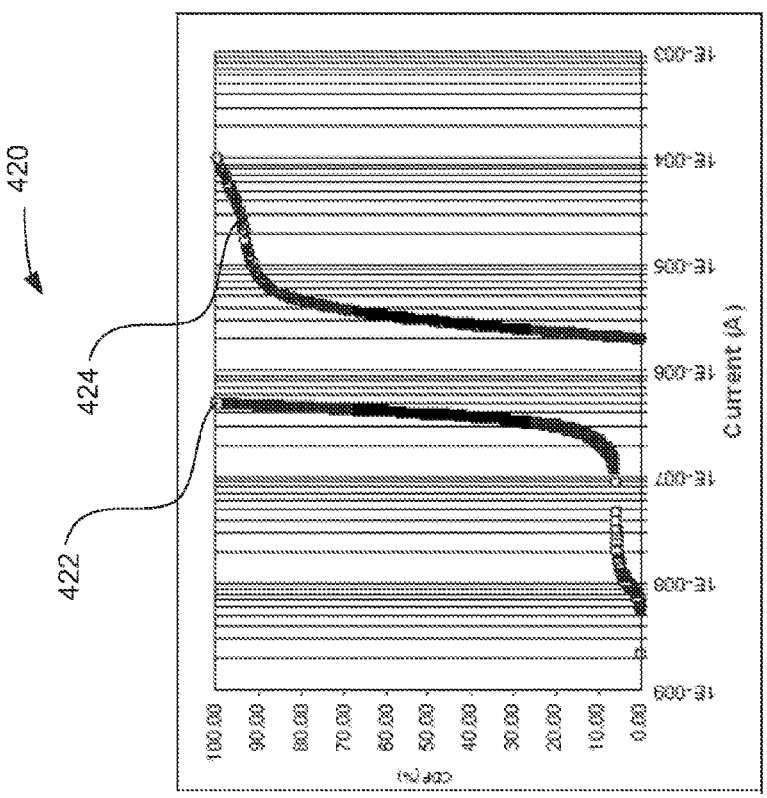

FIGS. 4B and 4C are distribution graphs 420 and 440 showing off current 422 and on current 424 and set voltage 442 and reset voltage 444 for a number of memory elements that were prepared. Hafnium oxide, when deposited as an amorphous layer, includes defects and traps. The defects form percolation paths in response to a set voltage and destroy the percolation paths in response to a reset voltage. Memory elements including a 50 Å thick hafnium oxide layer 406 were prepared.

The memory elements are a 50 Å hafnium oxide layer between 1000 Å titanium nitride and 800 Å platinum electrodes. The hafnium oxide layer was deposited using reactive sputtering with a hafnium target in an oxygen and argon containing atmosphere at 500 W and 5 mTorr. The devices were annealed at 750° Celsius (° C.). The $I_{ON}/I_{OFF}$ ratio for these devices shows good separation with low set and reset voltages.

5. Other Single Layer Memory Elements

Other metal oxides 406 may include high bandgap materials such as zirconium oxide, aluminum oxide, yttrium oxide, and tantalum oxide. The metal oxide 406 can also be a binary metal oxide such as a co-deposited hafnium oxide and aluminum oxide layer, a co-deposited hafnium oxide and titanium oxide layer, a co-deposited aluminum oxide and titanium oxide layer, or any combination of the materials described above. The metal oxide 406 may further be a ternary, quaternary, etc. metal oxide.

D. Oxide Stacks

1. Design

Memory elements 102 can also be constructed using multiple layers of oxides or "stacks." The combination of oxides can be used to impart desired characteristics to memory elements. Three types of layers: a base layer, a doping layer, and a defect access layer are described below. The oxide stack is formed in between two electrodes (i.e., an MIIM or MIIIM structure). The stack may also optionally include another electrical device such as a current steering element, described above. As described above, the metal oxides used for memory elements 102 can be deposited using any appropriate technique including dry (CVD, ALD, PVD, PLD, evaporation) and wet (electroless deposition, electrochemical deposition) techniques.

The operation of the memory elements 102 that include multiple layers of metal oxide is generally the same as that described for a single metal oxide layer memory element. For example, the set and reset pulses and percolation paths described above apply equally to both single layer metal oxide embodiments and multiple layer metal oxide embodiments.

Generally, oxide stacks can be used to impart desired characteristics to a memory element. For example, a defect access layer can increase the effective work function of an adjacent electrode, thereby allowing a lower work function electrode to be used. In some instances, stacking oxides can improve reset voltage distribution and site yield (i.e., the number of working memory elements 102).

i. Base Layer

The base layer is the metal oxide layer in which defects are present and in which the bulk-mediated switching takes place. The base layer is, in some embodiments, a high-bandgap (e.g., greater than 4 eV) material that preferably has leakage of less than 40 A/cm² in the off state measured at 0.5 V per 20 Å of thickness of the metal oxide, and the memory element has a set voltage of at least one volt per 100 Å of the base layer. In other embodiments, an increase in the thickness of the metal oxide of 100 Å can result in an increase of the set voltage of 1 V.

Doping into the base layer to create defects including traps can generally be isovalent or aliovalent and performed using a variety of techniques, for example: interdiffusion (using, for example, a doping layer and an anneal), implantation, and co-deposition. Aliovalent doping is described in further detail in the section regarding the doping layer.

Co-deposition describes techniques where multiple materials are deposited in one layer. For example, a hafnium oxide layer with an aluminum oxide dopant can be co-deposited. In one example, using reactive sputtering, an aluminum target and a hafnium target are bombarded in an oxygen and argon atmosphere. The concentration of the dopant in the layer can be determined by the power used on the dopant target. Other co-deposition techniques, including ALD co-injection can also be used. For example, with ALD co-injection, two sources metals are co-injected with an oxidant. Another embodiment utilizes the relative number of ALD deposition cycles of the dopant to the base metal oxide to adjust the effective doping concentration (e.g., nanolaminates).

Implantation such as ion implantation can be used to introduce dopants into metal oxides. If doping is performed using ion implantation, dopants may be the metals listed above, rather than their oxides.

ii. Doping Layer

A doping layer is another metal oxide layer adjacent to the base layer. The doping layer diffuses into the base layer or interdiffuses with the base layer when the stack is annealed or otherwise thermally treated (e.g., rapid thermal anneal (RTA), rapid thermal oxidation (RTO), rapid thermal forming gas anneal (RTF)). For example, using an aluminum oxide base layer, a titanium oxide doping layer can be deposited between the cathode and the base layer to create additional defects including substitional defects in the base layer.

The doping layer can be chosen to aliovalently dope into the base layer. For example, the base layer may be hafnium oxide and the doping layer can be aluminum oxide. A typical defect species of hafnium oxide is $Hf^{+4}$, and a typical defect species of aluminum oxide is $Al^{+3}$. $Al^{+3}$ ions displace $Hf^{+4}$ ions in the hafnium oxide layer, thereby creating defects and traps. In some embodiments, a doping layer (e.g., titanium oxide) may have the same most common oxidation state (e.g., +4) as the base layer. In these cases, aliovalent doping may still occur when other species having different oxidation states (e.g., $Ti^{+3}$) diffuse into the base layer.

iii. Defect Access Layer

A defect access layer is a layer between a positive electrode (e.g., the electrode 406) of the memory element 102 and the base layer. The defect access layer is a thin layer (i.e., 25% as thick as the base layer or less) that allows the electrode to "see" and access the defects in the base layer while in some embodiments reducing currents because of the increased resistivity of the defect access layer.

In some embodiments, one electrode has a higher work function that the other electrode. In these embodiments, the defect access layer is adjacent to the high work function electrode. The defect access layer can increase the effective work function of the adjacent electrode, thereby allowing the use of less noble or non-noble electrodes.

Additionally, depending on the materials chosen, the electrode 404 may better adhere to the metal oxide of the defect access layer 522 than the metal oxide of the base layer 502. Therefore, the defect access layer 522 can be used in materials systems to promote physical integrity of the memory element 102.

In another embodiment, the defect access layer can be a thin (e.g., less than 50 Å or less than 20 Å) stable oxide such as aluminum oxide. This facilitates the use of non-noble electrodes for the higher work function electrode (e.g., the electrode 404).

2. Structural Examples

Figure 5A:
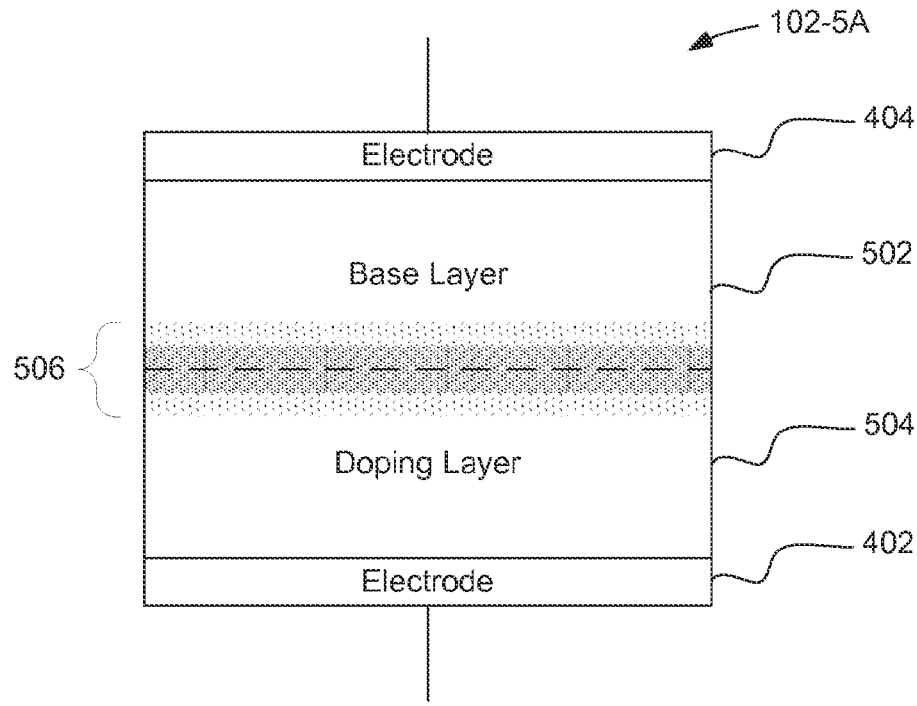
FIG. 5A illustrates a memory element using a stacked oxide system according to various embodiments.

FIG. 5A illustrates a memory element 102-5A using a stacked oxide system according to various embodiments. The memory element 102-5A includes the two electrodes 402 and 404, as well as a base layer 502 and a doping layer 504. The base layer 502 may be a transition metal oxide with a bandgap greater than 4 eV such as hafnium oxide, aluminum oxide, tantalum oxide or other materials described herein. The doping layer 504 is another material such as titanium oxide, scandium oxide, yttrium oxide, niobium oxide, or other doping materials described herein. In some embodiments, the doping layer 504 can be chosen so that the metal of the doping layer 504 has a different most common oxidation state than the metal of the base layer 502 (e.g., the base layer may be hafnium oxide with a $Hf^{4+}$ oxidation state and the doping layer can be aluminum oxide with an $Al^{3+}$ oxidation state). The doping layer 504 can have any appropriate thickness, and in some embodiments can be approximately as thick as the base layer 502, or can be between 25-200% as thick as the base layer, 10-500% as thick as the base layer, etc. as is appropriate for a specific materials system.

The memory element 102-5A includes an interdiffused region 506. The interdiffused region 506 can be formed by annealing the memory element 102-5A, for example at 300-1000° Celsius (° C.) for ten seconds (s) to four hours or more. The annealing causes the migration of charged species within the crystalline structure thereby forming or deepening defects and traps which can be used to form percolation paths.

Figure 5B:
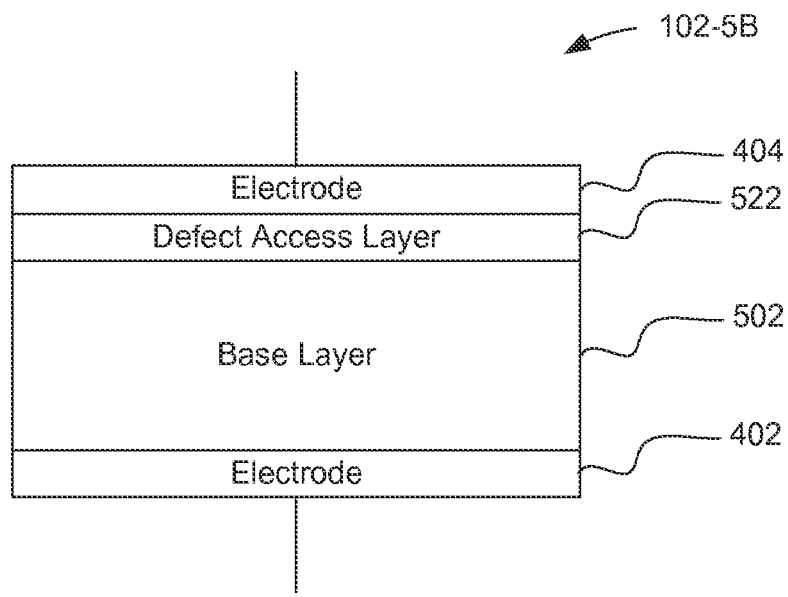
FIG. 5B illustrates a memory element that includes a defect access layer.

FIG. 5B illustrates a memory element 102-5B that includes a defect access layer 522. The defect access layer 522 is a thin layer of material (e.g., less than 25% the thickness of the base layer 502) that can be used to provide access to the defects in the base layer 502 and increase the effective work function of the electrode 404. The material for the defect access layer 522 may be selected from the same group as the doping materials, such as titanium oxide, niobium oxide, rare earth oxides, etc. For example, the base layer 502 may be a 50 Å hafnium oxide or aluminum oxide layer, while the defect access layer 522 is a 10 Å titanium oxide layer. The defect access layer 522 can also serve to dope the base layer 502 in a similar fashion as the doping layer 504.

Figure 5C:
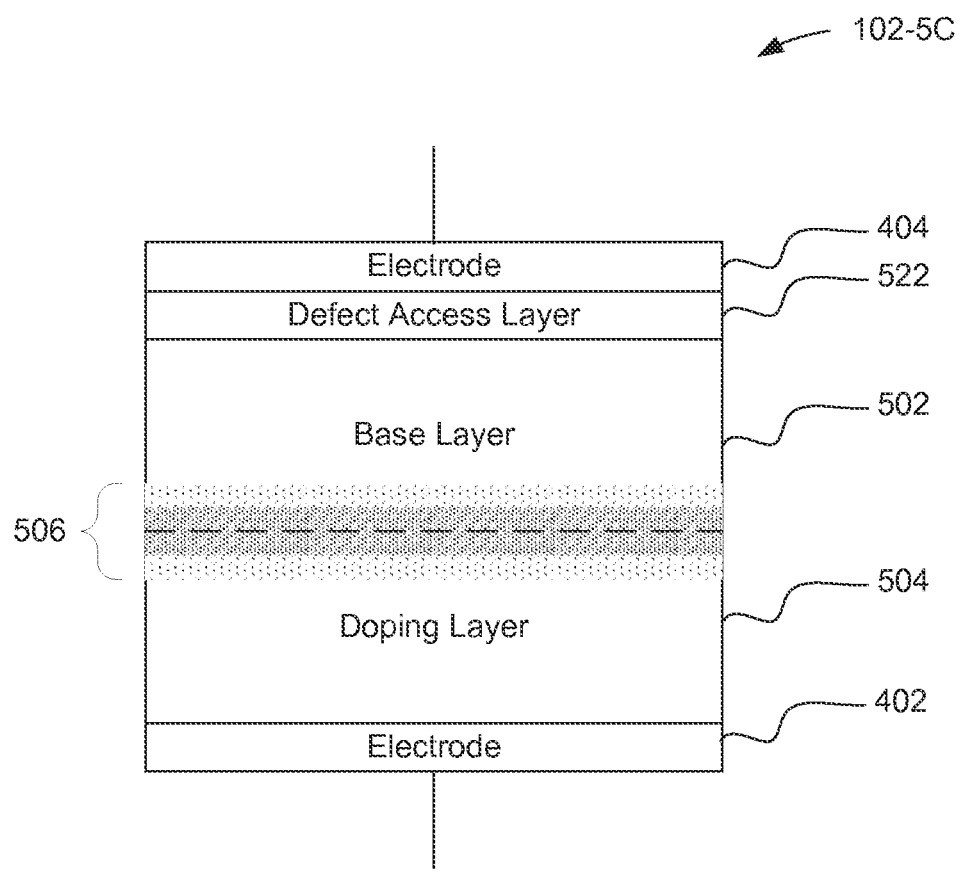
FIG. 5C illustrates a memory element that includes a doping layer, a base layer, and a defect access layer.

FIG. 5C illustrates a memory element 102-5C that includes a doping layer 504, a base layer 502, and a defect access layer 522. The three layer system can use materials chosen to dope from the doping layer 504 into the base layer 502, thereby creating defects in the base layer 502, and to increase the effective work function of the electrode 404. In some embodiments, the same material can be used for the defect access layer 522 and the doping layer 504.

3. Materials Systems Examples i. Hafnium Oxide and Aluminum Oxide

According to one embodiment, a memory element 102-5A can be created using a first electrode 402 that is titanium nitride, silicon, silicide, or a noble metal, a hafnium oxide base layer 502, an aluminum oxide doping layer 504, and a second electrode 404 that is a noble or near-noble metal such as platinum, iridium, iridium oxide, ruthenium, or ruthenium oxide.

In this system, additional defects are created by interdiffusion and aliovalently doping aluminum substitutionally into the hafnium oxide layer. The different oxidation states of hafnium and aluminum create traps, which mediate the bulk-mediated switching mechanism.

ii. Hafnium Oxide and Titanium Oxide

According to another embodiment, a memory element 102-5A can be created using a first electrode 402 that is titanium nitride, silicon, silicide, or a noble metal, a hafnium oxide base layer 502, a titanium oxide doping layer 504, and a second electrode 404 that is a noble or near-noble metal such as platinum, iridium, iridium oxide, ruthenium, or ruthenium oxide.

In this system, the resistivity of the titanium oxide doping layer 504 is greater than the resistivity of the hafnium oxide base layer 502. The increased resistivity of the titanium oxide doping layer 504 reduces the effective on current of the memory element 102-5A, which in some systems can protect the memory element and any current steering devices (e.g., transistors or diodes).

iii. Aluminum Oxide and Titanium Oxide

According to one embodiment, a memory element 102-5B can be created using a titanium nitride, silicon, silicide, or noble metal electrode 402, an aluminum oxide base layer 502, a titanium oxide defect access layer 522, and a platinum, iridium, iridium oxide, ruthenium, ruthenium oxide or other noble metal electrode 404. Alternatively, the electrode can be a non-noble material such as titanium nitride or tantalum nitride. The titanium oxide defect access layer 522 increases the effective work function of the electrode 404, thereby enabling a less noble electrode 404.

According to another embodiment, a memory element 102-5C can be created using the same configuration above and adding a titanium oxide doping layer 504. This memory element includes both doping using the doping layer 504 and access to defects and lower effective work function using the defect access layer 522. According to a further embodiment, a memory element 102-5A can be created using an aluminum oxide base layer 502 and a titanium oxide doping layer 504.

iv. Other Materials Systems

Various other combinations of materials can be created by using complementary materials. For example, the base layer can be any transition metal oxide having a bandgap greater than 4 eV, a set voltage of greater than 1V per 100 Å of thickness, and a leakage current density less than 40 A/cm$^2$ at 0.5 V per 20 Å of metal oxide in the off state. Examples include hafnium oxide, aluminum oxide, tantalum oxide, and zirconium oxide. The other layers can also be transition metal oxides, such as titanium oxide or niobium oxide. The other layers can be chosen because they are materials that exhibit high resistivity or other desirable characteristics. Some other examples include titanium oxide/hafnium oxide/titanium oxide stacks, hafnium oxide/yttrium oxide stacks, and yttrium oxide/hafnium oxide/yttrium oxide stacks.

Other characteristics can also be used to determine the composition of the memory element. For example, a memory element 102-5A can have a base layer 502 of one metal oxide and a doping layer 504 of a different metal oxide. For example, the base layer 502 can have a bandgap greater than four electron volts, and the doping layer 504 can aliovalently dope into the base layer 502. Another consideration when selecting metal oxide can be the electron affinity of the metal oxide. For example, the base layer 502 can have a higher electron affinity than the doping layer 504.

V. Memory Element Formation

Figure 6:
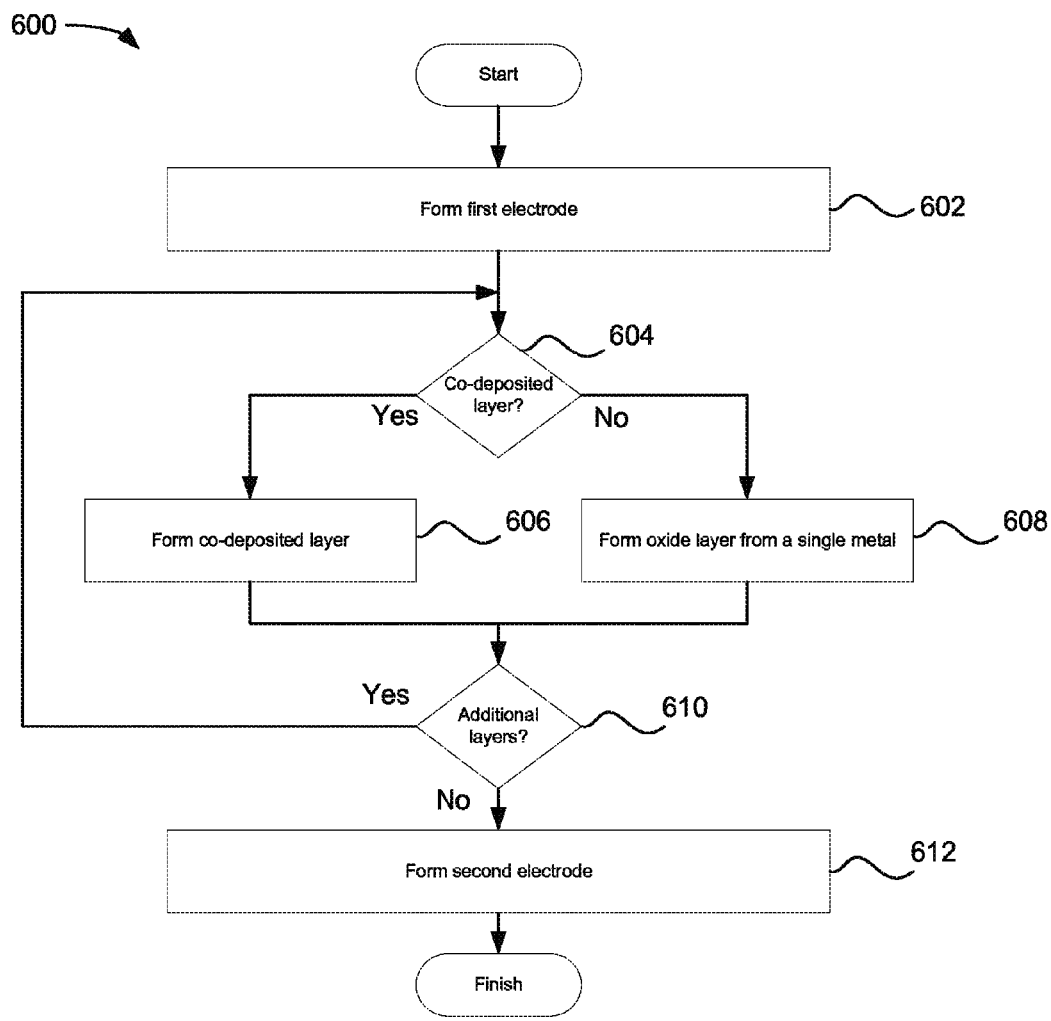
FIG. 6 is a flowchart describing a process for forming a memory element.

FIG. 6 is a flowchart describing a process 600 for forming a memory element. The process 600 is a general description of techniques used to form the memory elements described above. The process 600 describes techniques for forming a multi-layer memory element 102 generally including two electrodes and one or more layers of metal oxide disposed therebetween. Although certain processing techniques and specifications are described, it is understood that various other techniques and modifications of the techniques described herein may also be used.

In operation 602, a first electrode is formed. The first electrode can be formed on a substrate, for example, a silicon substrate that may include one or more layers already formed thereon. The first electrode may be formed over a signal line such as a bit line or a word line. The first electrode can be silicon, a silicide, titanium nitride, or other appropriate materials. In one example, a titanium nitride electrode is formed using PVD or another process described above. For example, the first electrode can be sputtered by bombarding a metal target at 150-500 W with a pressure of 2-10 mTorr for a deposition rate of approximately 0.5-5 Å/s. These specifications are given as examples; the specifications can vary greatly depending on the material to be deposited, the tool used to deposit the material, and the desired speed of deposition. The duration of the bombardment can determine the thickness of the electrode. Other processing techniques, such as ALD, PLD, CVD, evaporation, etc. can also be used to deposit the first electrode. In some embodiments, the first electrode is in contact with one of the signal lines 104 or 106. The first electrode may have any thickness, for example 10 Å-2000 Å.

In operation 604, it is determined whether the layer to be deposited will be co-deposited (i.e., two or more metals in the same layer). If the layer is to be co-deposited, in operation 606, a layer is co-deposited either over the first electrode or another oxide layer. For example, using PVD, a layer of hafnium oxide and aluminum oxide can be co-deposited using a co-sputtering arrangement with either a hafnium target and an aluminum target in an oxygen containing atmosphere or a hafnium oxide target and an aluminum oxide target. As another example, using ALD, a hafnium precursor and an aluminum precursor can be co-injected into the ALD chamber in desired proportions to co-deposit a metal oxide layer or formed via nano-laminates. If, in operation 604 it is determined that the layer is not to be co-deposited, the process 600 continues to operation 608.

In operation 608, a single layer of metal oxide is formed, either over the first electrode or another oxide layer. For example, the single layer of metal oxide may be a hafnium oxide layer formed using PVD. The layer may be a 5-500 Å layer formed using reactive sputtering with a metal hafnium target, a power of 100-1000 Watts (W), and a 20-60% oxygen atmosphere for a deposition rate of 0.1-1.0 Å/s. It is understood that the specifications for sputtering can vary greatly depending on tool used and desired deposition rate, and that these specifications are given as examples. In other embodiments a hafnium oxide target can be used, and different thicknesses can be formed. In a further embodiment, ALD can be used, for example to form a hafnium oxide layer using hafnium precursors such as tetrakis (diethylamido) hafnium (TDEAHf), tetrakis (dimethylamido) hafnium (TDMAHf), tetrakis (ethylmethylamido) hafnium (TEMAHf) or hafnium chloride ($HfCl_4$) and a suitable oxidant such as water, oxygen plasma, or ozone. Other deposition techniques, such as PLD, CVD, or evaporation can also be used. These deposition techniques can also be used to deposit other metal oxides (e.g., titanium oxide, tantalum oxide, aluminum oxide, etc.) described herein. Specifications for depositing these materials depend on the tool used and the material to be deposited. In operation 610, if additional metal oxide layers are to be deposited, the process 600 returns to operation 604. If no more metal oxide layers are to be deposited, the process 600 continues to operation 612. In operation 612, a second electrode is deposited over the metal oxide layers. The top electrode may be, according to some embodiments, a noble or near-noble metal such as iridium, iridium oxide, platinum, ruthenium, or ruthenium oxide deposited using PVD, ALD, CVD, PLD, evaporation, or another suitable technique. A platinum PVD top electrode can be deposited using PVD by sputtering a metal target at 100-500 W with a pressure of 2-10 mTorr for a deposition rate of 0.5-10 Å/s. The duration of the sputtering determines the thickness of the electrode. As mentioned above, it is understood that specifications for performing the deposition depend on the material to be deposited, the desired deposition rate, the tool being used, and other factors.

Although certain operational mechanisms are described herein, it is understood that the various embodiments are not bound by the theories of these operational mechanisms. Further, although the foregoing examples have been described in some detail for purposes of clarity of understanding, the invention is not limited to the details provided. There are many alternative ways of implementing the invention. The disclosed examples are illustrative and not restrictive.

What is claimed is:

1. A device comprising:
   a first electrode,
       wherein a material of the first electrode has a first work function;
   a first layer disposed over the first electrode,
       wherein the first layer has a first thickness;
   a second layer disposed over the first layer such that the first layer is disposed between the first electrode and the second layer,
       wherein the second layer directly interfaces the first layer and is aliovalently doped by the first layer;
       wherein the second layer has a second thickness;
   a third layer disposed over the second layer such that the second layer is disposed between the first layer and the third layer,
       wherein a composition of the first layer is different from a composition of the third layer;
       wherein the third layer has a third thickness less than 25% of the second thickness; and
   a second electrode disposed over the third layer such that the third layer is disposed between the second layer and the second electrode,
       wherein a material of the second electrode has a second work function greater than the first work function, and
       wherein the device is configured to switch between a high resistance state and a low resistance state.

2. The device of claim 1, wherein the second layer comprises one of hafnium oxide, tantalum oxide, zirconium oxide, or yttrium oxide, and wherein the first layer comprises one of titanium oxide or niobium oxide.

3. The device of claim 1, wherein the third layer comprises one of titanium oxide or aluminum oxide.

4. The device of claim 1, wherein the second electrode comprises one of platinum, nickel, iridium, iridium oxide, titanium nitride, tantalum nitride, ruthenium, ruthenium oxide, a ruthenium-titanium alloy, a nickel-titanium alloy, and a tantalum nitride/nickel/tantalum nitride stack.

5. The device of claim 1, wherein the first electrode comprises one of titanium nitride, silicide, or silicon.

6. The device of claim 1, wherein the first layer and the third layer comprise a same metal oxide.

7. The device of claim 1, wherein the first layer and the third layer comprise titanium oxide.

8. The device of claim 1, wherein a resistivity of the first layer is greater than a resistivity of the second layer.

9. The device of claim 8, wherein the first layer comprises titanium oxide, and wherein the second layer comprises hafnium oxide.

10. The device of claim 1, wherein the first layer comprises aluminum oxide, and wherein the second layer comprises hafnium oxide.

11. The device of claim 1, wherein the first layer comprises titanium oxide, wherein the second layer comprises hafnium oxide, and wherein the third layer comprises titanium oxide.

12. The device of claim 1, wherein at least one of the first layer and the third layer comprises yttrium oxide.

13. The device of claim 1, wherein both of the first layer and the third layer comprise yttrium oxide.

14. The device of claim 13, wherein the second layer comprises hafnium oxide.

15. The device of claim 1, wherein the second electrode is formed from a non-noble material.

16. The device of claim 1, wherein the third layer further increases an effective work function of the second electrode.

17. The device of claim 1, wherein the third layer has a thickness of less than 50 Angstroms.

18. The device of claim 1, wherein the third layer has a thickness of less than 20 Angstroms.

19. The device of claim 1, wherein the first layer comprises an oxide of a first metal, wherein the second layer comprises an oxide of a second metal, and wherein an oxidation state of the first metal in the first layer is different from an oxidation state of the second metal in the second layer.

20. The device of claim 1, wherein the device is operable as a memory element.

* * * * *